United States Patent [19]

Kothmann et al.

[11] 4,149,134
[45] Apr. 10, 1979

[54] VAPORIZATION-COOLED ELECTRICAL APPARATUS

[75] Inventors: Richard E. Kothmann, Churchill Borough; Donald K. Whirlow, Murrysville, both of Pa.

[73] Assignee: Elect Power Research Institute, Inc., Palo Alto, Calif.

[21] Appl. No.: 820,679

[22] Filed: Aug. 1, 1977

[51] Int. Cl.² ............................................. H01F 27/10
[52] U.S. Cl. .............................. 336/57; 165/DIG. 14; 174/15 R; 336/58; 336/61
[58] Field of Search ...................... 361/35, 37, 38, 41; 174/11 R, 12 R, 15 R, 17 LF, 17 GF; 165/105, DIG. 14; 336/55, 57, 58

[56] References Cited

U.S. PATENT DOCUMENTS

| | | | |
|---|---|---|---|
| 1,869,176 | 7/1932 | Palley | 174/12 R |
| 2,924,635 | 2/1960 | Narbut | 174/15 R |
| 3,830,063 | 8/1974 | Morgan | 165/DIG. 14 |

*Primary Examiner*—Thomas J. Kozma
*Attorney, Agent, or Firm*—D. R. Lackey

[57] ABSTRACT

A heat storage system provides overload capacity for a vaporization-cooled electrical apparatus. An external housing, containing a heat storage fluid, is disposed around a fluid conductor connecting a non-condensable gas storage reservoir and the radiator of a vaporization-cooled electrical apparatus. At normal loads, the non-condensable gas is contained within the fluid conductor and the storage reservoir thereby thermally isolating the storage fluid from the hot vapors contained within a radiator which keeps the storage fluid at ambient temperatures. A pressure increase, caused by an overload, compresses the non-condensable gas into the storage reservoir and allows the hot vapors to flow into a portion of the fluid conductor surrounded by the external housing whereby heat is dissipated from the hot vapors to the storage fluid contained within the external housing. Additional heat storage capacity is provided by a pressure relief valve in the external housing which allows the storage fluid contained therein to reach its boiling point and vaporize.

14 Claims, 1 Drawing Figure

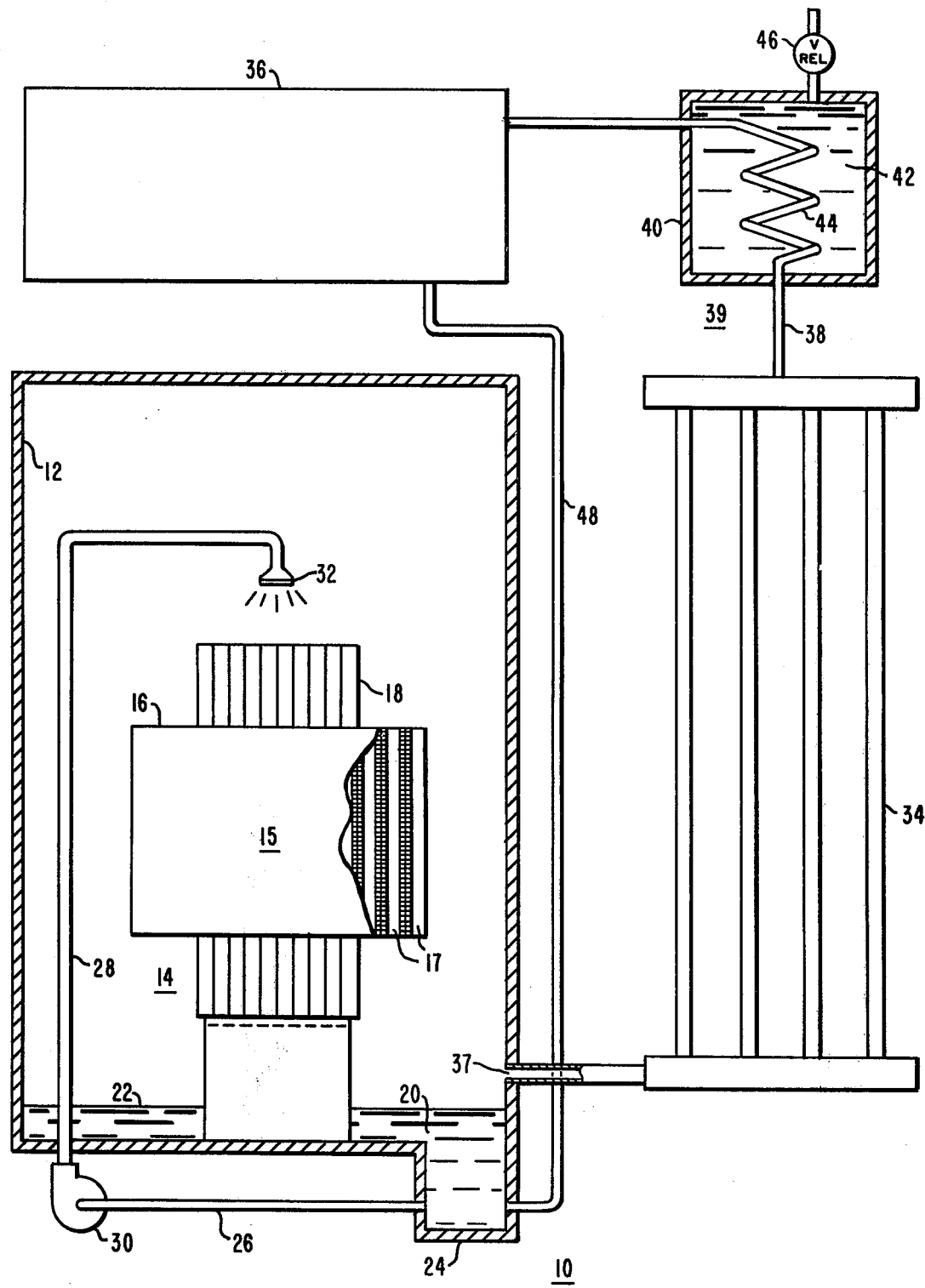

VAPORIZATION-COOLED ELECTRICAL APPARATUS

BACKGROUND OF THE INVENTION

1. Field of the Invention

This invention relates, in general, to electrical inductive apparatus and, more specifically, to vaporization-cooled electrical inductive apparatus.

2. Description of the Prior Art

Vaporization cooling systems have been proposed for electrical inductive apparatus, such as transformers, reactors and the like, which utilize a two-phase dielectric fluid having a boiling point within the normal operating temperature range of the electrical inductive apparatus. The dielectric fluid is supplied to the electrical inductive apparatus in its liquid state, whereon it evaporates as it contacts the heat producing members and removes heat in quantities equal to the latent heat of vaporization of the dielectric fluid. The resulting vapors are then condensed and reapplied to the heat producing elements in a continuous cycle. In addition to providing cooling, the vaporization of such a dielectric fluid also provides the necessary electrical insulation between the electrical elements in its vapor phase at the nominal operating temperature and pressure of the electrical inductive apparatus. Since the insulating properties of the vaporized dielectric fluid are directly proportional to the pressure existing within the enclosure surrounding the electrical apparatus, it is common to add a second dielectric fluid, typically a non-condensable gas, such as sulfur hexafluoride ($SF_6$), to provide adequate electrical insulation when the apparatus is initially energized or operating at very light loads.

It is known that vaporization-cooled electrical inductive apparatus, such as transformers, have a relatively short thermal time constant compared to conventional oil-filled transformers which results in a rapid increase in the temperature and pressure within the casing during transient overload conditions. In an oil-filled unit, excessive temperature normally results only in the loss of insulation life. In a vaporization-cooled electrical apparatus, an overload results in a large pressure increase which, if permitted to continue, would require compliance with expensive pressure vessel construction codes to prevent rupture of the transformer tank.

A typical prior art method of increasing the overload capacity with vaporization-cooled transformer has been to add additional cooling surfaces to the cooling system of the transformer. However, a large increase in cooling capacity is required to provide adequate overload capacity due to the exponential increase in heat generated by the transformer $I^2R$ losses. For example, a 1,000 KVA transformer has a 100% load loss of 11.5 KW and a 200% load loss of 37.5 KW. The additional cooling capacity required to dissipate the additional heat loss caused by overload conditions is not only expensive but also results in an objectionable increase in the overall size of the electrical apparatus.

Thus, it would be desirable to provide a vaporization-cooled electrical apparatus which has an improved overload capacity. It would also be desirable to provide the improved overload capacity for a vaporization-cooled electrical inductive apparatus by an inexpensive method and, further, in such a way that the overall size of the electrical apparatus is not significantly increased.

SUMMARY OF THE INVENTION

Herein disclosed is a novel heat storage system which provides improved overload capacity for vaporization-cooled electrical apparatus. The electrical apparatus consists of a sealed housing containing an electrical winding disposed in inductive relation with a magnetic core. A pump supplies dielectric fluid, vaporizable within a normal operating temperature range of the electrical apparatus, from a sump in the bottom of the housing to a spray device, situated above the winding, which uniformly distributes the fluid over the winding. Upon contacting the heat producing winding, the dielectric fluid vaporizes thereby dissipating heat in quantities equal to the latent heat of vaporization of the fluid. A quantity of non-condensable gas initially fills the housing to provide electrical insulation for the electrical members upon energization and during light loads. The evolved vapors of a dielectric fluid and the noncondensable gas flow into a primary cooler or radiator wherein the vapors condense and subsequently flow back into the sump within the main housing and the non-condensable gas, having a lower density than the vapors of the dielectric fluid, rises to the top portion of the radiator and, as such, is separated from the vapors of the dielectric fluid. A fluid conductor is disposed between the radiator and a storage reservoir thereby providing a fluid flow path for the non-condensable gas. An auxiliary cooling means comprising a housing is disposed around a portion of the fluid conductor and contains a quantity of cooling fluid therein.

As the electrical apparatus reaches its normal operating temperature, substantially all of the non-condensable gas is contained in the fluid conductor and storage reservoir thereby thermally isolating the cooling fluid in the auxiliary housing from the hot vapors of the radiator which keeps the cooling fluid at ambient temperature. When the electrical apparatus experiences an overload, the pressure within the main housing and radiator will increase. This pressure increase will compress the non-condensable gas from the fluid conductor into the storage reservoir and allow hot vapors to flow from the radiator into the portion of the fluid conductor surrounded by the auxiliary housing. Additional heat storage capacity is thereby attained since the hot vapors dissipate heat to the cooling fluid contained within the auxiliary housing.

This additional heat storage capacity is attained with a much smaller cooling system than that utilized in prior art vaporization-cooled electrical apparatus for overload capacity. By thermally isolating the cooling fluid from the hot vapors until the start of an overload condition, the cooling fluid remains at ambient temperature and can thereby dissipate additional quantities of heat for the same volume of cooling fluid. This not only reduces costs, but also does not significantly increase the overall size of the electrical apparatus.

Additional heat storage is provided by a pressure relief valve disposed on the auxiliary housing. This valve enables the cooling fluid to reach its boiling point and vaporize thereby taking advantage of the large increase in heat dissipation provided by the latent heat of vaporization of the cooling fluid. Alarm means are necessary to indicate that service is necessary since the future overload capacity of the system is impaired due to the reduced amount of cooling fluid contained within the auxiliary housing.

BRIEF DESCRIPTION OF THE DRAWING

The various features, advantages and additional uses of this invention will become more apparent by referring to the following detailed description and the accompanying drawing in which there is shown an elevation view, partially in section, of an electrical inductive apparatus constructed according to the teachings of this invention.

DESCRIPTION OF THE PREFERRED EMBODIMENT

In the drawing, there is shown an electrical inductive apparatus 10 constructed according to the teachings of this invention. The electrical inductive apparatus 10 consists of a sealed enclosure or housing 12 surrounding a heat producing member 14, such as a transformer, reactor or the like and, hereafter, referred to as a transformer. The transformer 14 consists of a magnetic core and coil assembly 15 having phase windings 16 disposed in inductive relation with a magnetic core 18. For clarity, the electrical leads and bushings normally used to connect the phase windings 16 to an external electrical circuit are not shown. A plurality of ducts 17 extend through the phase windings 16 whereby the windings 16 are exposed to the flow of the dielectric fluid as described hereafter.

The transformer 14 is cooled by a dielectric fluid which has its boiling point within a normal operating temperature range of the transformer 14. In addition to providing adequate cooling, the dielectric fluid 20 also provides electrical insulation between the turns of the phase windings 16 at the normal operating temperature and pressure of the transformer 14. As known to those skilled in the art, fluid dielectrics with the above-described properties generally include the inert fluorinated organic compounds. Examples of such compounds that may be used to practice this invention are listed in detail in U.S. Pat. No. 2,961,476; issued to Maslin and Narbut. Since these types of dielectric above the windings fluids are quite costly, economics dictates that the amount of such fluids used to cool the transformer 14 be minimized. Accordingly, a small quantity of dielectric fluid 20 is disposed within the casing 12 to a level 22 above the bottom portion of the casing 12. Further, a sump 24 is provided in the bottom portion of the housing 12 to collect the recondensed vapors of the dielectric fluid 20. Since a minimal amount of the dielectric fluid 20 is utilized to cool the transformer 14, suitable means for applying the dielectric fluid 20 to the windings 16 of the transformer 14 is required. According to the preferred embodiment of this invention, the means of application includes first and second conduits 26 and 28, respectively, and a pump 30 which are disposed in fluid flow communication with the sump 24 whereby the dielectric fluid 20 contained within the sump 24 is applied to the phase windings 16 of the transformer 14. A suitable spray device 32 is situated above the winding 16 and is connected to conduit 28 in order to provide a uniform distribution of the dielectric fluid 20 to the vertical ducts 17 disposed within the phase windings 16.

In operation, dielectric fluid 20 will be pumped from the sump 24 through first and second conduits 26 and 28, respectively, and spray device 32 by a pump 30 and be applied in a uniform film to the vertical ducts 17 extending through the phase windings 16 of the transformer 14. A portion of the dielectric fluid 20 contained within the vertical ducts 17 will evaporate as it contacts the heat producing windings 16 thereby cooling the windings 16 by dissipating heat in quantities equal to the latent heat of vaporization of the dielectric fluid 20. The evolved vapors of the dielectric fluid 20 will flow through the vertical ducts 17 into the interior of the housing 12 whereon a portion will recondense on the walls of the housing 12 and flow back into the sump 24 in the bottom portion of the housing 12. A larger portion of evolved vapors will flow into a first or primary cooling means 34, such as a radiator or cooler, which is disposed in fluid flow communication with the housing 12 through opening 37 whereon the vapors will condense on the exposed cooling surfaces of the radiator 34 and will flow through the opening 37 into the sump 24 and the housing 12 and be reapplied by the supply means to the phase windings 16 in a continuous cycle.

As noted above, the vapors of the dielectric fluid 20 provide adequate electrical insulation between the turns of the windings 16 when the transformer 14 is at its normal operating temperature and pressure range. However, the dielectric properties of the fluids utilized in the preferred embodiment of this invention are directly proportional to the pressure and temperature existing within the housing 12 of the electrical apparatus 10. When the transformer 14 is initially energized or operating at light loads, only a small portion of the dielectric fluid 20 is in the gaseous state thereby providing insufficient electrical insulation for the windings 16. Accordingly, a second dielectric fluid is used in combination with the vaporizable dielectric fluid 20 to provide the necessary electrical insulation for the initial energization of the electrical apparatus 10. This fluid, typically a non-condensable gas, such as sulfur hexafluoride ($SF_6$), fills a major portion of the volume of the housing 12 at no-load conditions and provides the necessary insulation between turns of the windings 16. However, the temperature of the transformer 14 will rise directly with the applied load and the composition of the atmosphere within the housing 12 will thereby contain greater proportions of the vapors of the vaporizable dielectric fluid 20. To prevent excessive pressure buildup within the housing 12 and also to maintain cooling efficiency, the non-condensable gas must be separated from the vaporizable dielectric fluid 20 and be removed from the main enclosure 12. Thus, a suitable storage means, such as reservoir 36, is provided. A connecting means, such as a fluid conductor or conduit 38, is disposed in fluid flow communication between the radiator 34 and the reservoir 36 and defines a fluid flow path for the non-condensable gas.

As load is applied to the transformer 14, increasing quantities of the dielectric fluid 20 will be vaporized thereby increasing the pressure within the housing 12. This increased pressure will cause the mixture of non-condensable gas and vaporized dielectric fluid 20 to flow from the housing 12 through opening 37 into the radiator 34 whereon the vapors of the dielectric fluid 20 will condense and flow back into the housing 12 to the sump 24. Since the vapors of the dielectric fluid 20 utilized in the preferred embodiment of this invention have a much greater density than non-condensable gases, such as sulfur hexafluoride, the non-condensable gas will rise to the upper portion of the radiator 34 thereby effectively separating it from the vaporized dielectric fluid 20. When the transformer 14 reaches its normal operating range, substantially all of the non-condensable gas will be removed from the housing 12 and the radiator 34 and will be contained in the storage reservoir 36 and the conduit 38 which has the effect of maximizing the cooling efficiency since vaporized dielectric fluid 20 is exposed to the entire cooling surface of the radiator 34.

During their lifetime, electrical inductive apparatus, such as transformers, experience frequent overloads of up to 200% rated load and lasting for several hours. These overload conditions cause an exponential rise in the heat loss of the transformer due to the $I^2R$ losses in the windings. In a conventional oil-filled transformer, the excessive temperature caused by the overload condition normally results only in a loss of insulation life. In a vaporization-cooled transformer however, excessive temperature results in a large pressure increase which, if permitted to continue, would rupture the housing of the transformer. To dissipate this additional quantity of heat, a novel method for attaining overload capacity for a vaporization-cooled transformer is provided.

As shown in the drawing, a second or auxiliary cooling means 39 is provided which consists of a sealed housing 40 surrounding a portion 44 of the conduit 38 connecting the radiator 34 and the storage reservoir 36 in heat transfer relationship with the ends of the conduit 38 extending through the housing 40. A fluid 42, with good heat storage capacity, is disposed within the housing 40. By way of example and not of limitation, the heat storage fluid 42 could simply be water or an antifreeze mixture comprised of water and ethylene glycol could be used in order to protect the storage fluid 42 from the extreme low temperature it may experience during its use. In order to provide a large heat storage capacity per unit of storage fluid 42, the housing 40 is disposed external to the tank 12 of the electrical apparatus 10 thereby isolating the heat storage fluid 42 from the heat producing members of the electrical apparatus 10. This has the effect of maximizing storage capacity within the storage fluid 42 since, at the beginning of an overload condition, the storage fluid is maintained at approximately ambient temperature (40° C). In addition, it has been found that shaping the portion 44 of the conduit 38 surrounded by the housing 40 in the form of a coil not only minimizes space usage, but further maximizes the amount of surface of the conduit 38 that is exposed to the storage fluid 42.

As previously described, the volumes of the housing 12, radiator 34, storage reservoir 36 and conduit 38 are such that substantially all of the non-condensable gas is contained within the conduit 38 and the storage reservoir 36 when the transformer 14 is operating at its rated or full load. At rated load, the hot vapors of the dielectric fluid 20 are prevented from flowing into the conduit 38 and the storage reservoir 36 since the pressure within these volumes is approximately equal to the pressure within the tank 12 and the radiator 34. Thus, the storage fluid 42 is thermally isolated from the hot vapors contained within the radiator 34 and the tank 12 and thereby remains substantially at ambient temperature (40° C). When an overload occurs on the transformer 14, the pressure within the tank 12 and the radiator 34 will increase. The pressure increase above the normal operating pressure of the transformer 14 within the radiator 34 acts like a thermal switch in that it compresses a portion of a non-condensable gas contained within the conduit 38 into the storage reservoir 36 and thereby allows the hot vapors to flow from the radiator 34 into the portion 44 of the conduit 38 contained within the sealed housing 40. The hot vapors of the dielectric fluid 20 contained within the portion 44 of the conduit 38 dissipate heat in quantities equal to the latent heat of vaporization of the dielectric fluid 20 to the storage fluid 42 whereon the vapors condense and flow through the lower end of conduit 38 into the radiator 34 and are returned to the sump 24 in the housing 12. During an extended overload condition, a small portion of the hot vapors of the dielectric fluid 20 could flow through the conduit 38 into the storage reservoir 36. A conduit or other suitable fluid conductor 48 is provided between the bottom of the storage reservoir 36 and the sump 24 in the tank 12 to provide a fluid flow path for the condensed vapors of the dielectric fluid 20 from the storage reservoir 36 to the sump 24.

For a better understanding of this invention, a specific example will now be provided. A 1,000 KVA transformer has a 100% load loss of 11.5 KW and a 200% load loss of 37.5 KW. The transformer tank has a volume of 16.4 ft.$^3$, an internal radiator volume 34 of 1.4 ft.$^3$, a conduit 38 volume of 1.0 ft.$^3$, a storage housing 40 volume of 7.0 ft.$^3$ and a storage reservoir 36 volume of 22.75 ft.$^3$. Under a 100% load, the tank 12 and radiator 34 would operate at 120.8° C at a pressure of 28.2 psia. At the start of a 200% load condition, the system pressure would increase to 29.4 psia and the system vapor temperature to 122° C which would compress the non-condensable gas from the conduit 38 into the storage reservoir 36. With the storage fluid 42 being at ambient temperature (40° C) at the start of the overload, the system would operate at the above pressure and temperature for approximately one-half hour at a 200% load. Approximately 400 lbs. of a storage fluid 42, such as water, would be required to dissipate the heat from the vaporized dielectric fluid 20 and keep the storage fluid 42 below 100° C for a half-hour overload period.

Thus, approximately 8.0 cubic feet of auxiliary cooling means maintained the electrical apparatus 10 at a substantially constant temperature and pressure for a one-half hour overload period of a 200% load. A prior art vaporization-cooled electrical apparatus utilizing additional radiator cooling surface for overload capacity would required 5.2 cubic feet of additional internal radiator volume. Due to the thin fin-type design of a typical radiator, a 5.2 cubic foot increase in internal volume would consume approximately 56 cubic feet of gross volume. Thus, the unique heat storage system disclosed herein provides the same overload capacity as typical prior art methods, but with a smaller volume of additional cooling surface. In addition, the smaller condenser volume reduces the cost of providing overload capacity for a vaporization-cooled transformer and at the same time does not significantly increase the overall size of the transformer.

Additional heat storage capacity can be attained and the allowable overload period can be prolonged considerably if the storage fluid 42 is allowed to reach its boiling point and vaporize. Accordingly, suitable means, such as pressure relief valve 46, is provided to allow the storage fluid 42 to reach its boiling point and vaporize. According to the preferred embodiment of this invention, the pressure relief valve 46 is set at 0.2 atm above ambient pressure which would thereby let the water evaporate through the pressure relief valve 46 when it had reached its boiling point of 105° C. This provides approximately a 900% increase in the amount of heat than can be dissipated by the storage fluid 42 since the latent heat of vaporization of water is approximately 970 Btu/lb while the amount of heat dissipated by the water in going from 40° C to 100° C is only 108 Btu/lb. This method would require the use of an alarm or other indicating means, not shown, to indicate that the unit must be serviced before being subjected to further overloads since a portion of the storage fluid 42 has evaporated.

It will be apparent to one skilled in the art that there has been herein disclosed a unique heat storage system that provides a vaporization-cooled electrical inductive apparatus with improved overload capacity. By disposing the external heat storage system between the non-condensable gas storage reservoir and the radiator of a transformer, the storage fluid contained within the auxiliary housing remains at ambient temperature since it is thermally isolated from the hot vapors of the dielectric fluid contained within the radiators under normal operating loads. During overload conditions, the increase in pressure in the radiator compresses a portion of the non-condensable gas from the conduit into the storage reservoir and thereby allows a portion of the hot vapors of the dielectric fluid to flow into the portion of the conduit surrounded by the auxiliary housing whereon heat is dissipated from the hot vapors by the storage fluid contained within the auxiliary housing. The novel heat storage system disclosed herein provides an extended overload capacity for a vaporization-cooled electrical inductive apparatus with a minimal increase in condenser volume which not only reduces the cost of the cooling system for the electrical inductive apparatus but further does not significantly increase the overall size of the electrical inductive apparatus.

What is claimed is:

1. An electrical apparatus comprising:
   a sealed housing;
   a heat producing member disposed within said housing;
   a quantity of dielectric fluid, vaporizable within the normal operating temperature range of said electrical apparatus, disposed within said housing;
   means for applying said dielectric fluid onto said heat producing member such that a portion of said fluid vaporizes as it contacts said heat producing member dissipating heat from said heat producing member;
   first means disposed in fluid communication with said sealed housing for cooling said vapors of said dielectric fluid, said first cooling means being operative to provide sufficient cooling of said heat producing member under normal operating conditions;
   storage means;
   means for connecting said storage means and said first cooling means in fluid flow communication;
   a gas, substantially non-condensable over the normal operating temperature and pressure range of said electrical apparatus, flowable between said sealed housing, said first cooling means, said connecting means and said storage means in response to the flow of said vapors of said dielectric fluid;
   second means for cooling said vapors of said dielectric fluid, said second cooling means being separate from said first cooling means and disposed in heat transfer relation with said connecting means, said second cooling means being operable only when said heat producing member is operated above said normal operating conditions; and
   means for maintaining said second cooling means at ambient temperature while said heat producing member is operated at said normal operating conditions.

2. The electrical apparatus of claim 1 wherein the maintaining means is responsive to a predetermined pressure within the housing and the first cooling means for allowing the vapors of the dielectric fluid to flow into the connecting means only when the heat producing member is operated at conditions above normal operating conditions such that heat is dissipated from said vapors of said dielectric fluid to said second cooling means.

3. The electrical apparatus of claim 2 wherein the maintaining means includes the storage means, the connecting means and the first cooling means having predetermined volumes such that substantially all of the non-condensable gas is disposed within said storage and said connecting means when said electrical apparatus is at its normal operating temperature and pressure whereby the vapors of the dielectric fluid are prevented from flowing into said connecting means and entering into heat transfer relationship with the second cooling means such that said second cooling means remains at ambient temperature.

4. The electrical apparatus of claim 1 wherein the second cooling means includes an auxiliary housing with a quantity of cooling fluid disposed therein, said auxiliary housing being disposed external to the housing of said electrical apparatus and surrounding a portion of the connecting means with the ends of the connecting means extending therethrough.

5. The electrical apparatus of claim 4 wherein the maintaining means includes the storage means, the connecting means and the first cooling means having predetermined volumes such that substantially all of the non-condensable gas is disposed within said storage and said connecting means when said electrical apparatus is at its normal operating temperature and pressure whereby the vapors of the dielectric fluid are prevented from flowing into said connecting means and entering into heat transfer relationship with the cooling fluid in the auxiliary housing.

6. The electrical apparatus of claim 5 wherein the first cooling means includes a radiator having first and second openings, said first opening being disposed in fluid flow communication with the housing of said electrical apparatus and said second opening being disposed in fluid flow communication with the connecting means.

7. The electrical apparatus of claim 6 wherein the connecting means includes a conduit disposed in fluid flow communication with the radiator on one end and the storage means on the other end.

8. The electrical apparatus of claim 4, wherein the second cooling means includes means for vaporizing said cooling fluid.

9. The electrical apparatus of claim 8 wherein the vaporizing means includes a pressure relief valve extending through the auxiliary housing with said pressure relief valve being actuated at a pressure slightly above ambient pressure.

10. The electrical apparatus of claim 4 wherein the cooling fluid is water.

11. The electrical apparatus of claim 4 wherein the cooling fluid is a mixture of water and ethylene glycol such that said cooling fluid is sufficient to withstand any low ambient temperatures to which said apparatus may be subjected.

12. The electrical apparatus of claim 4 wherein the portion of the connecting means surrounded by the auxiliary housing is in the form of a coil.

13. An electrical inductive apparatus comprising:
 a sealed housing, a sump defined in the bottom portion of said housing;
 electrical windings disposed in inductive relation with a magnetic core;
 a plurality of cooling ducts extending through said windings;
 a dielectric fluid, vaporizable within the normal operating temperature range of said electrical inductive apparatus disposed within said sump;
 a pump;
 a spray device disposed above said windings for uniformly distributing said dielectric fluid to said vertical ducts disposed in said windings such that a portion of said fluid evaporates as it contacts the heat producing windings dissipating heat therefrom;
 a first conduit disposing said pump and said sump in fluid flow communication;
 a second conduit disposing said pump and said spray device in fluid flow communication;
 a gas, non-condensable within the normal operating temperature and pressure range of said electrical inductive apparatus, said non-condensable gas filling a large portion of said housing when said electrical inductive apparatus is de-energized;
 a storage reservoir for said non-condensable gas;
 a radiator having first and second openings therein, said first opening disposing said radiator in fluid flow communication with said housing of said electrical inductive apparatus, said radiator providing cooling for said electric winding under normal operating conditions;
 a fluid conductor having first and second ends, said first end disposed in fluid flow communication with said second opening of said radiator, said second end of said fluid conductor disposed in fluid flow communication with said storage reservoir;
 a sealed casing surrounding a portion of said fluid conductor with the ends of said fluid conductor extending therethrough;
 a cooling fluid disposed within said sealed casing;
 a pressure relief valve disposed through said sealed casing such that said cooling fluid therein can vaporize;
 said storage reservoir, said fluid conductor and said radiator having predetermined volumes such that substantially all of said non-condensable gas is disposed within said storage reservoir and said fluid conductor when said electrical inductive apparatus is at normal operating temperature and pressures so as to maintain said cooling fluid in said sealed casing at ambient temperature and, further, said storage reservoir, said fluid conductor and said radiator cooperating with a pressure increase in said housing above said normal operating pressure to compress said non-condensable gas from said fluid conductor into said storage reservoir whereby said vapors of said dielectric fluid flow into said fluid conductor from said radiator and the heat contained therein is dissipated by said cooling fluid stored within said sealed casing.

14. An electrical inductive apparatus of claim 13 wherein the cooling fluid is an anti-freeze mixture of water and ethylene glycol such that said cooling fluid is able to withstand any low ambient temperatures to which said apparatus may be subjected.

* * * * *